US010141926B2

(12) United States Patent
Frankel et al.

(10) Patent No.: US 10,141,926 B2
(45) Date of Patent: Nov. 27, 2018

(54) ULTRA-LOW POWER CROSS-POINT ELECTRONIC SWITCH APPARATUS AND METHOD

(71) Applicant: Ciena Corporation, Hanover, MD (US)

(72) Inventors: Michael Y. Frankel, Bethesda, MD (US); Vladimir Pelekhaty, Baltimore, MD (US)

(73) Assignee: Ciena Corporation, Hanover, MD (US)

( * ) Notice: Subject to any disclaimer, the term of this patent is extended or adjusted under 35 U.S.C. 154(b) by 31 days.

(21) Appl. No.: 15/213,541

(22) Filed: Jul. 19, 2016

(65) Prior Publication Data

US 2018/0026632 A1    Jan. 25, 2018

(51) Int. Cl.
*H03K 17/687* (2006.01)
*H03K 17/60* (2006.01)

(52) U.S. Cl.
CPC . *H03K 17/6872* (2013.01); *H03K 2217/0036* (2013.01)

(58) Field of Classification Search
CPC ...... H03K 17/51; H03K 17/56; H03K 17/687; H03K 17/6871; H03K 17/6872; H03K 17/6874; H03K 2217/0036
USPC ........ 327/185, 199–201, 207, 208, 210–212, 327/214, 427, 434, 436
See application file for complete search history.

(56) References Cited

U.S. PATENT DOCUMENTS

| 4,849,751 | A  | 7/1989  | Barber et al.  |           |
|-----------|----|---------|----------------|-----------|
| 5,777,505 | A  | 7/1998  | LaRue          |           |
| 6,356,111 | B1 | 3/2002  | Moss           |           |
| 6,737,958 | B1 | 5/2004  | Satyanarayana  |           |
| 6,965,299 | B1 | 11/2005 | Daily et al.   |           |
| 8,305,111 | B2 | 11/2012 | Preisach       |           |
| 8,625,371 | B2 | 1/2014  | Ware et al.    |           |
| 8,885,467 | B2 * | 11/2014 | Godfrey ...... | H04L 41/5035 370/230 |
| 8,923,781 | B2 * | 12/2014 | Kunishi ...... | H03K 3/354 327/415 |

(Continued)

OTHER PUBLICATIONS

Donghyup Shin et al., IEEE Transactions on Microwave Theory and Techniques, vol. 60, No. 2, Feb. 2012, A 0.01-8-GHz (12.5 Gb/s) 4 4 CMOS Switch Matrix, pp. 381-386.

(Continued)

*Primary Examiner* — Lincoln Donovan
*Assistant Examiner* — Diana J Cheng
(74) *Attorney, Agent, or Firm* — Clements Bernard Walker PLLC; Christopher L. Bernard; Lawrence A. Baratta, Jr.

(57) ABSTRACT

An electrical switch circuit adapted to switch digital, high-speed signals with low power includes a plurality of input buffers each coupled to an input transmission line of a plurality of input transmission lines, wherein each input buffer utilizes a digital inverter; a plurality of output buffers each coupled to an output transmission line of a plurality of output transmission lines, wherein each output buffer utilizes a digital inverter; and a plurality of switches each coupled to an associated input transmission line and an associated output transmission line, wherein each of the input transmission line, the output transmission line, and the plurality of switches are in a single line configuration. For the low power, each of the input buffers, the output buffers, the input transmission lines, and the output transmission lines can be unterminated.

18 Claims, 6 Drawing Sheets

(56) References Cited

U.S. PATENT DOCUMENTS

| | | |
|---|---|---|
| 9,124,383 B1 | 9/2015 | Frankel et al. |
| 2009/0147896 A1 | 6/2009 | Frankel et al. |
| 2015/0075957 A1 | 3/2015 | Frankel |
| 2015/0076923 A1 | 3/2015 | Frankel et al. |
| 2015/0242331 A1* | 8/2015 | Van Winkelhoff ....... G11C 7/20 711/163 |
| 2015/0304137 A1* | 10/2015 | Azin .................... H03K 5/2481 375/312 |
| 2017/0104481 A1* | 4/2017 | Ko ...................... A61B 8/4483 |

OTHER PUBLICATIONS

Donghyup Shin et al., A 32-Gbps 4x4 Passive Cross-Point Switch in 45-nm SOI CMOS, University of California, San Diego, La Jolla, CA 92093-0407, USA, pp. 1-4.

Sung-Joon Lee et al., A 256-Radix Crossbar Switch Using Mux-Matrix-Mux Folded-Clos Topology, Journal of Semiconductor Technology and Science, vol. 14, No. 6, Dec. 2014, pp. 760-767.

Adilson S. Cardoso, Thesis Paper, Design of High-Isolation and Wideband RF Switches in SiGe BICMOS Technology for Radar Applications, Georgia Institute of Technology, May 2012.

Jin-Woo Kim, Thesis Paper, SiGe High Speed Crossbar Switch for Digital Signal Router and Phased Array Antenna Systems, Rensselaer Polytechnic Institute, Troy, New York, Jul. 2009.

* cited by examiner

ULTRA-LOW POWER CROSS-POINT ELECTRONIC SWITCH APPARATUS AND METHOD

FIELD OF THE DISCLOSURE

The present disclosure generally relates to electrical circuitry systems and methods. More particularly, the present disclosure relates to an ultra-low power cross-point electronic switch apparatus and method that can be utilized in networking applications for a flow switch to switch high data rate digital signals, such as in a Reconfigurable Electrical Add/Drop Multiplexer, a data center flow switch, etc.

BACKGROUND OF THE DISCLOSURE

A cross-point switch (also known as a crossbar switch, a matrix switch, etc.) includes various switches arranged in a matrix configuration with multiple input and output lines that form a crossed pattern of interconnecting lines between which a connection may be established by closing a switch located at each intersection, the elements of the matrix. There are applications in networks for high-data-rate cross-point switches, such as to replace optical switches where electronic switches can provide better performance and cost especially when coupled with photonic integration and to augment packet layer switching such as in data centers where cross-point switches can provide superior power performance over packet switches, especially for large data flows that do not need packet layer switching, i.e., large flows between adjacent switches. In these applications, the high-data-rate cross-point switches provide switching of connections at data rates of 10 Gb/s and above, i.e., flow switching of entire wavelengths of traffic. Example applications of the high-data-rate cross-point switches for networking applications are described in commonly-assigned U.S. Pat. No. 9,124,383, "HIGH CAPACITY FIBER-OPTIC INTEGRATED TRANSMISSION AND SWITCHING SYSTEMS," and commonly-assigned U.S. patent application Ser. No. 14/924,802, "HIGH PORT COUNT SWITCHING MODULE, APPARATUS, AND METHOD," the contents of which are incorporated by reference.

There are existing cross-point switches which address high-data-rate signals. Generally, conventional cross-point switches are implemented as active switches using a mux/selector architecture in a silicon-germanium (SiGe) process to accommodate the fast data rate. Importantly, conventional cross-point switches focus on preserving signal quality within the matrix configuration using complex and power inefficient circuitry such as linear amplifiers, differential lines, line termination elements, and the like. Specifically, conventional cross-point switches have a power consumption of several Watts or more. Other approaches have considered simple Complementary metal-oxide semiconductor (CMOS)-based designs such as in U.S. Pat. No. 6,356,111, but these approaches only suggest a single N-type metal-oxide-semiconductor (NMOS) switching element which will not work for high-data-rate signals (i.e., 10 Gb/s and above) due to excessive cross-talk and insufficient transmission of high bits ("1's"). Yet other approaches have shown analog-type cross-point switches, but these are not optimized for digital Non-Return to Zero (NRZ) signal transmission and use NMOS only devices as switching elements along with full termination of transmission lines. This approach is appropriate for analog signal transmission as it preserves signal quality, but it is extremely excessive for digital NRZ signals from power, cost, and complexity perspective.

In terms of a cross-point switch for switching digital signals, it is necessary to minimize power consumption, cost, and complexity such that the cross-point switch can be an effective replacement for optical switches as well as effectively augment packet switches in a layered approach.

BRIEF SUMMARY OF THE DISCLOSURE

In an exemplary embodiment, an electrical switch circuit adapted to switch digital, high-speed signals with low power includes a plurality of input buffers each coupled to an input transmission line of a plurality of input transmission lines, wherein each input buffer utilizes a digital inverter; a plurality of output buffers each coupled to an output transmission line of a plurality of output transmission lines, wherein each output buffer utilizes a digital inverter; and a plurality of switches each coupled to an associated input transmission line and an associated output transmission line, wherein each of the input transmission line, the output transmission line, and the plurality of switches are in a single line configuration. Each of the input buffers and output buffers can be tri-state buffers with an enable signal. For the low power, each of the plurality of input transmission lines and the plurality of output transmission lines can be unterminated. For the low power, each of the plurality of input buffers and the plurality of output buffers can be unterminated. For the low power, each of the plurality of input buffers, the plurality of output buffers, the plurality of input transmission lines, and the plurality of output transmission lines can be unterminated.

Each of the plurality of switches can be in a series-shunt-series configuration including a first series switch, a shunt switch, and a second series switch, wherein the first series switch and the second series switch can include a combination of N-type metal-oxide-semiconductor (NMOS) transistors and P-type metal-oxide-semiconductor (PMOS) transistors, and wherein the shunt switch can include a combination of NMOS and PMOS transistors. The first two-stage buffer can include a combination of N-type metal-oxide-semiconductor (NMOS) transistors and P-type metal-oxide-semiconductor (PMOS) transistors, and wherein the second two-stage buffer can include a combination of N-type metal-oxide-semiconductor (NMOS) transistors and P-type metal-oxide-semiconductor (PMOS) transistors. The plurality of input buffers, the plurality of output buffers, and the plurality of switches are arranged in a tile and can include an N×N cross-point switch, wherein an M×M cross point switch, M>N, is formed by a plurality of tiles, and wherein each tile is sized smaller than a bit period of the digital, high-speed signals. The plurality of tiles internal to the M×M cross-point switch connect to one another via tri-state buffers which are either one of enabled for data operation or disabled.

In another exemplary embodiment, an electrical switch circuit method adapted to switch digital, high-speed signals with low power includes providing a plurality of input buffers each coupled to an input transmission line of a plurality of input transmission lines, wherein each input buffer utilizes a digital inverter; providing a plurality of output buffers each coupled to an output transmission line of a plurality of output transmission lines, wherein each output buffer utilizes a digital inverter; and providing a plurality of switches each coupled to an associated input transmission line and an associated output transmission line, wherein each of the input transmission line, the output transmission line, and the plurality of switches are in a single line configuration. Each of the input buffers and output buffers can be tri-state buffers with an enable signal. For the low power, each of the plurality of input transmission lines and the plurality of output transmission lines can be unterminated. For the low power, each of the plurality of input buffers and the plurality of output buffers can be unterminated. Each of the plurality of switches is in a series-shunt-series configuration including a first series switch, a shunt switch, and a second series switch, wherein the first series switch and the second series switch include a combination of N-type metal-oxide-semiconductor (NMOS) transistors and P-type metal-oxide-semiconductor (PMOS) transistors, and wherein the shunt switch includes a combination of NMOS transistors. The plurality of input buffers, the plurality of output buffers, and the plurality of switches can be arranged in a tile and include an N×N cross-point switch, wherein an M×M cross point switch, M>N, is formed by a plurality of tiles, wherein each tile is sized smaller than a bit period of the digital, high-speed signals, and wherein the plurality of tiles internal to the M×M cross-point switch connect to one another via tri-state buffers which are either one of enabled for data operation and disabled.

In a further exemplary embodiment, an M×M cross-point switch adapted to switch digital, high-speed signals with low power includes one or more tiles each including an N×N cross-point switch, wherein each cross-point switch includes: a plurality of input buffers each coupled to an input transmission line of a plurality of input transmission lines, wherein each input buffer utilizes a digital inverter; a plurality of output buffers each coupled to an output transmission line of a plurality of output transmission lines, wherein each output buffer utilizes a digital inverter; and a plurality of switches each coupled to an associated input transmission line and an associated output transmission line, and wherein each of the input transmission line, the output transmission line, and the plurality of switches are in a single line configuration. For the low power, each of the plurality of input buffers, the plurality of output buffers, the plurality of input transmission lines, and the plurality of output transmission lines is unterminated. Each switch of the plurality of switches is in a series-shunt-series configuration including a first series switch, a shunt switch, and a second series switch, wherein the first series switch and the second series switch can include a combination of N-type metal-oxide-semiconductor (NMOS) transistors and P-type metal-oxide-semiconductor (PMOS) transistors, and wherein the shunt switch can include a combination of NMOS and PMOS transistors. The plurality of input buffers can include a first two-stage buffer of two digital inverters and the plurality of output buffers include a second two-stage buffer of two digital inverters, wherein the first two-stage buffer can include a combination of N-type metal-oxide-semiconductor (NMOS) transistors and P-type metal-oxide-semiconductor (PMOS) transistors, and wherein the second two-stage buffer can include a combination of N-type metal-oxide-semiconductor (NMOS) transistors and P-type metal-oxide-semiconductor (PMOS) transistors. The plurality of tiles internal to the M×M cross-point switch connect to one another via tri-state buffers which are either one of enabled for data operation and disabled, and wherein each tile is sized smaller than a bit period of the digital, high-speed signals.

BRIEF DESCRIPTION OF THE DRAWINGS

The present disclosure is illustrated and described herein with reference to the various drawings, in which like reference numbers are used to denote like system components/method steps, as appropriate, and in which.

DETAILED DESCRIPTION OF THE DISCLOSURE

Figure 1:
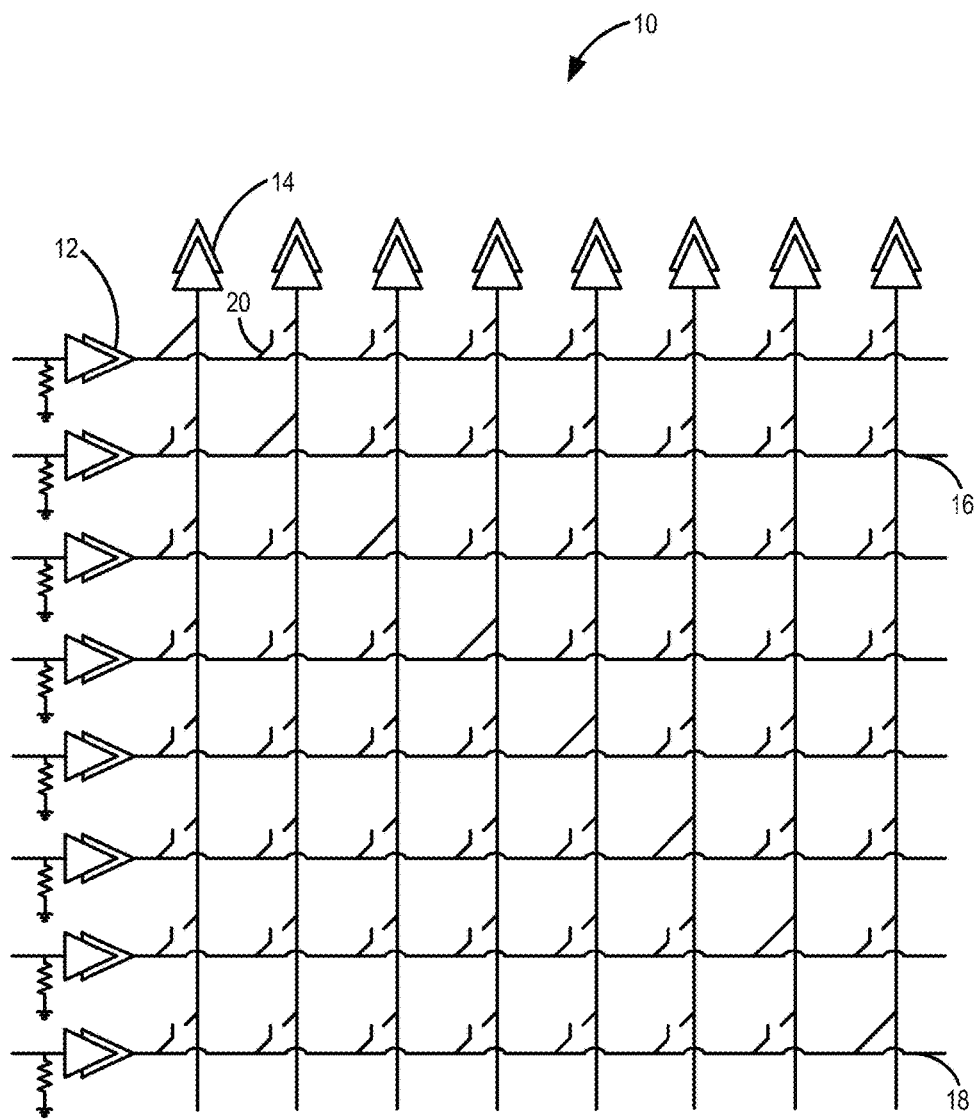
FIG. 1 is a logical diagram of an N×N cross-point switch where N is 8.

Again in various exemplary embodiments, the present disclosure relates to an ultra-low power cross-point electronic switch apparatus and method that can be utilized in networking applications for a flow switch to switch high data rate digital signals, such as in a Reconfigurable Electrical Add/Drop Multiplexer, a data center flow switch, etc. The apparatus and method recognize digital signals do not require excessive signal conditioning and line termination to enable an extremely low power, low cost, and low complexity design, as they can be frequently regenerated. As such, the apparatus and method provide an extremely low power, low cost, and low complexity design for a cross-point switch configured to switch high-speed digital signals (e.g., NRZ or some other on-off modulated signal type at 10 Gb/s or more). That is, the high-speed digital signals in the apparatus and method are switched at their line rate, and the signals can be on-off modulated high-speed signals. The apparatus and method do not rely on deserializing to lower rates for internal operations within the switch.

With respect to power consumption, the apparatus and method provide milliwatt (mW) power consumption compared to several Watts (W) for conventional high-speed cross-point switches. For physical realization, the apparatus and method provide an extremely compact design, such as in CMOS, and the compact design minimizes submicron CMOS wafer costs. The apparatus and method are a very low latency fabric which is useful in credit-based protocols such as Infiniband, Peripheral Component Interconnect Express (PCIe), and the like. The apparatus and method are presented in a strictly non-blocking architecture. Additionally, the apparatus and method include a fully asynchronous fabric where ports can independently run at different rates, using a multi-rate Clock and Data Recovery (CDR) circuit, with such different rates including, for example, 10 Gb/s, 16 Gb/s, 25 Gb/s, 32 Gb/s, or any other high-speed data rate. The apparatus and method support a fast reconfiguration with transistor switch state change on the order of about 10 ps with the limit set by control signals. Further, the apparatus and method can provide multicast capabilities, at a slight power consumption penalty.

In an exemplary embodiment, the apparatus and method include a CMOS cross-point switch, such as an N×N switch where N is an integer. Larger switch fabrics are described herein as combinations of an N×N switch tile to form a larger composite switch such as an M×M switch, where M is an integer greater than N. In an exemplary embodiment, N can be 8, i.e., an 8×8 switch where M×M switches is formed based on the 8×8 switch. Thus, with an 8×8 switch, larger switches can include 16×16, 32×32, 64×64, etc.

The CMOS cross-point switch utilizes various techniques and approaches to reach the design objectives. The CMOS cross-point switch can include pure digital "inverters" for driver and regenerator stages, a transistor cross-connect resistive switch in a series/shunt/series arrangement with P-type metal-oxide-semiconductor logic (PMOS) and N-type metal-oxide-semiconductor logic (NMOS) for both the series connections and for the shunt.

Additionally, the CMOS cross-point switch proposes unterminated transmission lines and buffer stages. Advantageously, this approach significantly reduces power consumption, for example, removing 50Ω resistors for line termination. The unterminated transmission lines and buffer stages work because digital signals are more tolerant to distortions. Additionally, another aspect enabling the unterminated transmission lines and buffer stages include constructing tiles for the N×N switch to have a size much smaller than the bit period of the associated signals thereon (a lumped model). Finally, in the M×M switch, tri-state buffers must be used to make sure unused outputs do not load subsequent lines, i.e., shut down of unused buffers. While the CMOS cross-point switch is described herein in a tile arrangement, other arrangements are also contemplated such as a Clos arrangement or the like.

Referring to FIG. 1, in an exemplary embodiment, a logical diagram illustrates an N×N cross-point switch 10 where N is 8. The cross-point switch 10 includes input buffers 12 (which can also be referred to as drive buffers), output buffers 14, horizontal transmission lines 16 coupled to the input buffers 12, vertical transmission lines 18 coupled to the output buffers 14 and switches 20 between each cross-over point of the horizontal transmission lines 16 and the vertical transmission lines 18. Of course, the terminology horizontal and vertical is presented merely for illustration purposes. The horizontal transmission lines 16 and the vertical transmission lines 18 are multiple inputs and output lines that form a crossed pattern of interconnecting lines between which the switches 20 can establish a connection at each intersection. That is, there are N input buffers 12, each with a corresponding high-speed signal, and the high-speed signal for each of the N input buffers 12 can be provided to any one of the N output buffers 14 by closing the corresponding switch 20, with all other switches 20 on the same transmission lines 16, 18 open. Multicast can be achieved by allowing more than one switch 20 to be closed at a time for a specific horizontal transmission line 16, at the cost of additional power on the input buffer 12.

Figure 2:
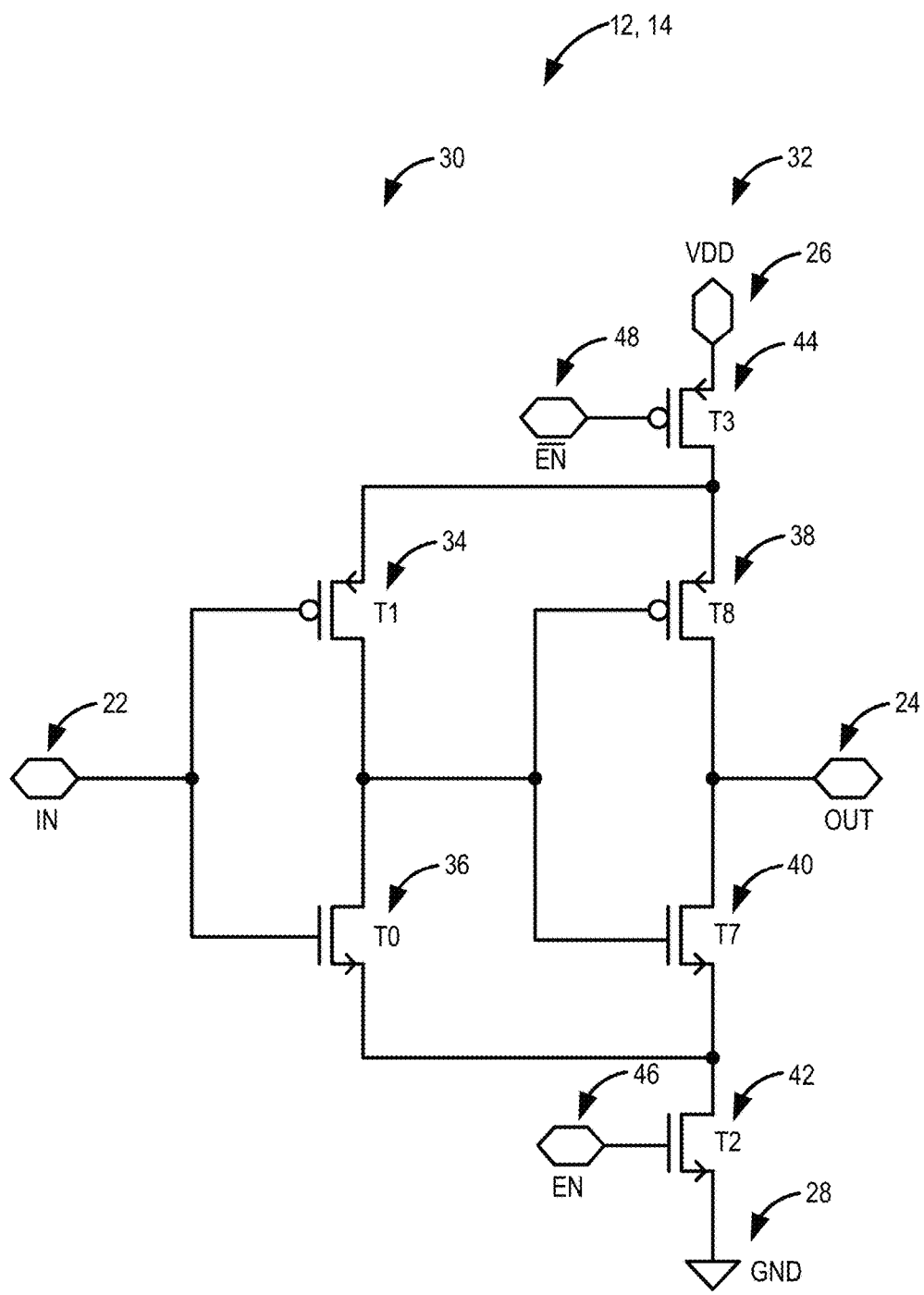
FIG. 2 is a circuit diagram of an exemplary implementation of the tri-state buffers for the cross-point switch in FIG. 1 using a two-stage buffer design.

Referring to FIG. 2, in an exemplary embodiment, a circuit diagram illustrates an exemplary implementation of the tri-state buffers 12, 14 for the cross-point switch 10 using a two-stage buffer design. Conventionally, buffers in cross-point electrical switches are designed as quasi-linear amplifying elements, with feedback to stabilize operation in the quasilinear portion of the transfer curve, to ensure signal integrity through the switch. Of course, quasi-linear amplifying elements have additional power consumption. The cross-point switch 10 uses simple inverters, which eliminates quiescent current, substantially reduces power consumption, and improves performance. The buffers 12, 14 include an input 22 and an output 24. For both the input buffer 12 and the output buffer 14, the input 22 is configured to receive a high-speed digital signal which may be distorted, such as in terms of the rise and fall times and with an imperfect waveform, and the output 24 includes a reconditioned signal with a cleaner, squarer wave. The buffers 12, 14 are repeaters that refine the high-speed digital signal, i.e., smoothing out the square wave in terms of values for "0" and "1." The buffers 12, 14 include a voltage (VDD) 26 connection and a ground connection 28. The buffers 12, 14 include two stages 30, 32 between the input 22 and the output 24. Further, to insure that N×N switches can be cascaded to form larger M×M switches, buffers include transistors 42, 44 that realize tri-state operation. These transistors do not operate at data rates, but only at switch reconfiguration rate, and can therefore be made larger to provide lower impedance when enabled. Enable signals 46, 48 are configured such that transistors 42, 44 are turned on when data transmission is desired, and turned off when data transmission is not needed on the specific line. This configuration has better performance characteristics, such as power consumption, than series switches used in published implementations.

Each of the stages 30, 32 is a digital inverter which is used to provide independent buffer input and output impedance optimization. The first stage 30 includes two transistors 34, 36, including a PMOS transistor 34 and an NMOS transistor 36. The second stage 32 includes two transistors 38, 40, including a PMOS transistor 38 and an NMOS transistor 40. Note, the values of the transistors 34, 36, 38, 40 can be different between the input buffer 12 and the output buffer 14, with the values optimized for the input and output impedance optimization. In each of the stages 30, 32, the buffers 12, 14 can use slightly larger PMOS transistors 34, 38, compared to the NMOS transistors 36, 40 to provide a more symmetric operation with improved margins (due to hole versus electron mobility difference).

In contrast to typical high-speed cross-point switches, the cross-point switch 10 operates with single-ended connections between the input buffer 12 and the output buffer 14. Further, while traditional cross-points operate with connections implemented as transmission lines, the implementation of the cross-point switch 10 also uses connections without any impedance matching, i.e., there are no resistive loads used at either output of the input buffers 12, and the ends of horizontal transmission lines 16, or at inputs to the output buffer 14. Again, signal quality is less important due to the digital nature of the high-speed signals, but signal quality at the highest data rate of interest is achieved by careful control of the following parameters:

The physical switch size of the cross-point switch 10 is kept shorter than a wavelength at baud rate, i.e., the electrical data rate of the high-speed signals (e.g., 10 Gb/s or higher). The physical switch size determines the value of N;

The equivalent lumped element capacitance (C) and inductance (L) load of the metal transmission lines 16, 18;

An optimization of the input buffer 12 transistor size;

An optimization of the output buffer 14 transistor size; and

An optimization of the capacitive load presented by the active transmission gate switches 20 loading each horizontal/vertical intersection point of the transmission lines 16, 18.

But we specifically point out that this design does not need to optimize transmission line characteristic impedance, as is the case with conventional design currently being practiced in the industry.

For example, with respect to keeping the physical switch size shorter than the electrical data rate of the high-speed signals. Frequency emissions associated with the cross-point switch 10 are related to half of the bit rate of the high-speed signals. Assume the high-speed signals are about 30 Gb/s, the corresponding frequency is 15 GHz. An 8×8 switch in an exemplary 32 nm CMOS process is small enough to ignore reflection; whereas a 32×32 switch (in a single tile) would have too excessive delay of reflection.

Note, the input buffers 12, the switches 20, and the output buffers 14 can support asynchronous operation where each port or lines 16, 18 can operate at different speeds, e.g., 10 Gb/s, 16 Gb/s, 25 Gb/s, 32 Gb/s, etc.

Figure 3:
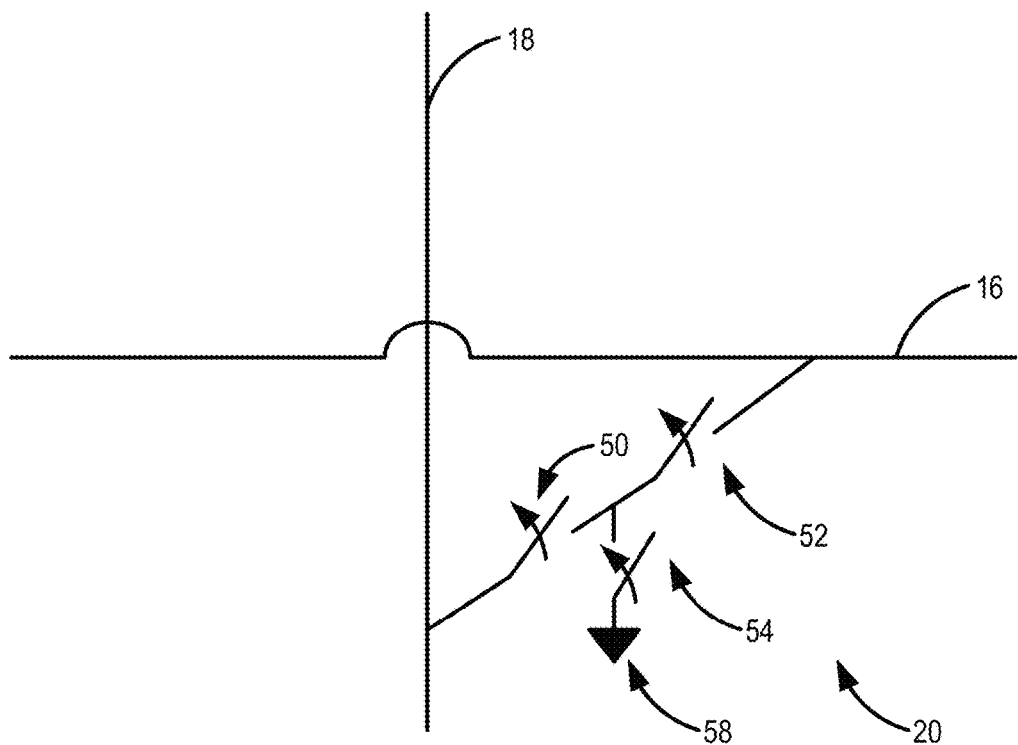
FIG. 3 is a logical diagram of the function of the switches between each cross-over point of the horizontal transmission lines and the vertical transmission lines in the cross-point switch in FIG. 1.
Figure 4:
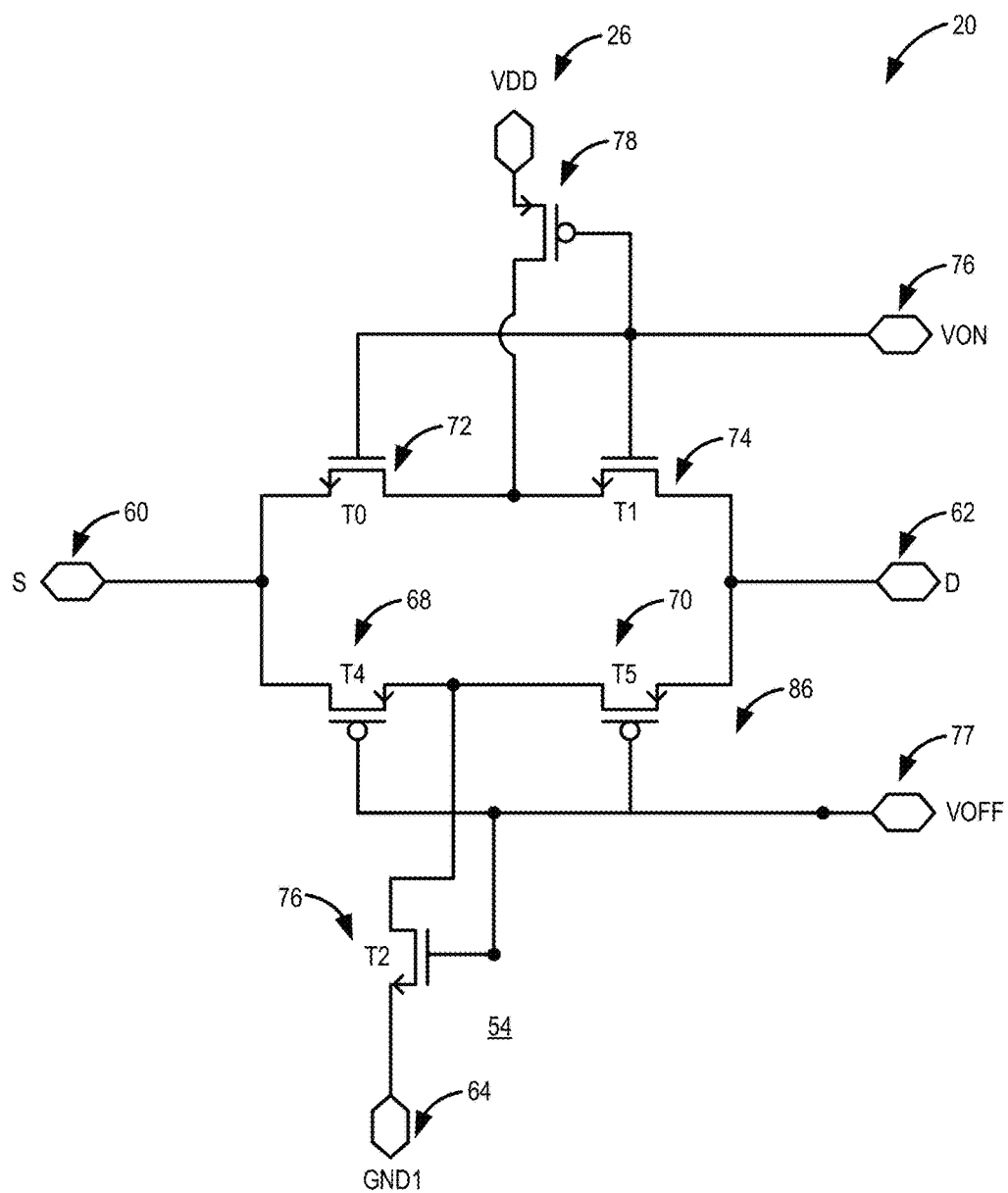
FIG. 4 is a circuit diagram of an exemplary implementation of the switch for the cross-point switch in FIG. 1 using a series-shunt-series configuration.

Referring to FIG. 3, in an exemplary embodiment, a logical diagram illustrates the function of the switches 20 between each cross-over point of the horizontal transmission lines 16 and the vertical transmission lines 18 using a series-shunt-series configuration. Referring to FIG. 4, in an exemplary embodiment, a circuit diagram illustrates an exemplary implementation of the switch 20 for the cross-point switch 10 using a series-shunt-series configuration. In FIG. 3, the switch 20 includes two series NMOS transistors 72, 74 and a shunt PMOS transistor 78 coupled to power rail VDD 26. This series-shunt-series branch allows high fidelity transmission of voltages in the 0 to VDD/2 range, and suppresses parasitic signal cross talk during 0 to VDD transitions. The switch 20 further includes two series PMOS transistors 68, 70 and a shunt NMOS transistor 76 coupled to ground 64. This series-shunt-series branch allows high fidelity transmission of voltages in the VDD/2 to VDD range, and suppresses parasitic signal cross talk during VDD to 0 transitions. The output 62 is coupled to the vertical line 18, the input 60 is coupled to the horizontal line 16. Cross-point switches are prone to cross-talk from having multiple crossing lines with corresponding switch transistors providing limited isolation. In order to minimize cross-talk, the series-shunt-series configuration is implemented for the switch 20. FIG. 3 shows a functional schematic, and FIG. 4 shows an exemplary transistor level implementation.

In FIG. 4, an exemplary circuit level implementation is illustrated for the switch 20. To close the switch 20 (a closed state of the switch 20), i.e., provide a connection between the transmission lines 16, 18, the series transistors 68, 70, 72, 74 are closed and the shunt transistors 76, 78 are open. To open the switch 20 (an open state of the switch 20), i.e., prevent a connection between the transmission lines 16, 18, the series transistors 68, 70, 72, 74 are open and the transistors 76, 78 are closed. In the open state, the series transistors 68, 70, 72, 74 have drain to source capacitance, leading to signal coupling and cross talk from line 16 to line 18. The shunt transistors 76, 78 are configured to clamp cross talk to ground and VDD rails. Of note, the switch 20 is a single line configuration, not a differential line as typically implemented in cross-point switches.

The switch 20 includes control signals (VON, VOFF) 76, 77 which collectively connect to the gate terminals of series transistors 68, 70, 72, 74 and the shunt transistors 76, 78. The control signals 76, 77 control the states of the switch 20, i.e., the open state and the closed state. The control signals 76, 77 support fast reconfiguration of the switch 20, capable of changing the transistor switch states of the switches in around 10 ps.

Figure 5:
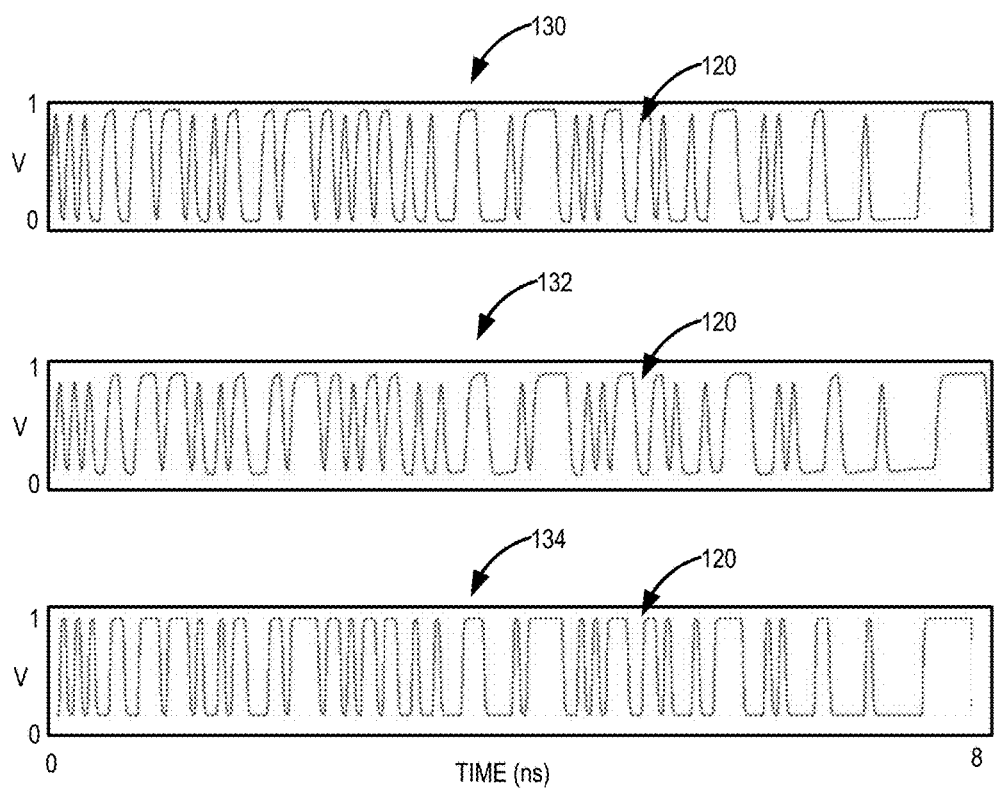
FIG. 5 is graphs of exemplary waveforms of a high-speed signal through the 8×8 cross-point switch of FIG. 1.
Figure 6:
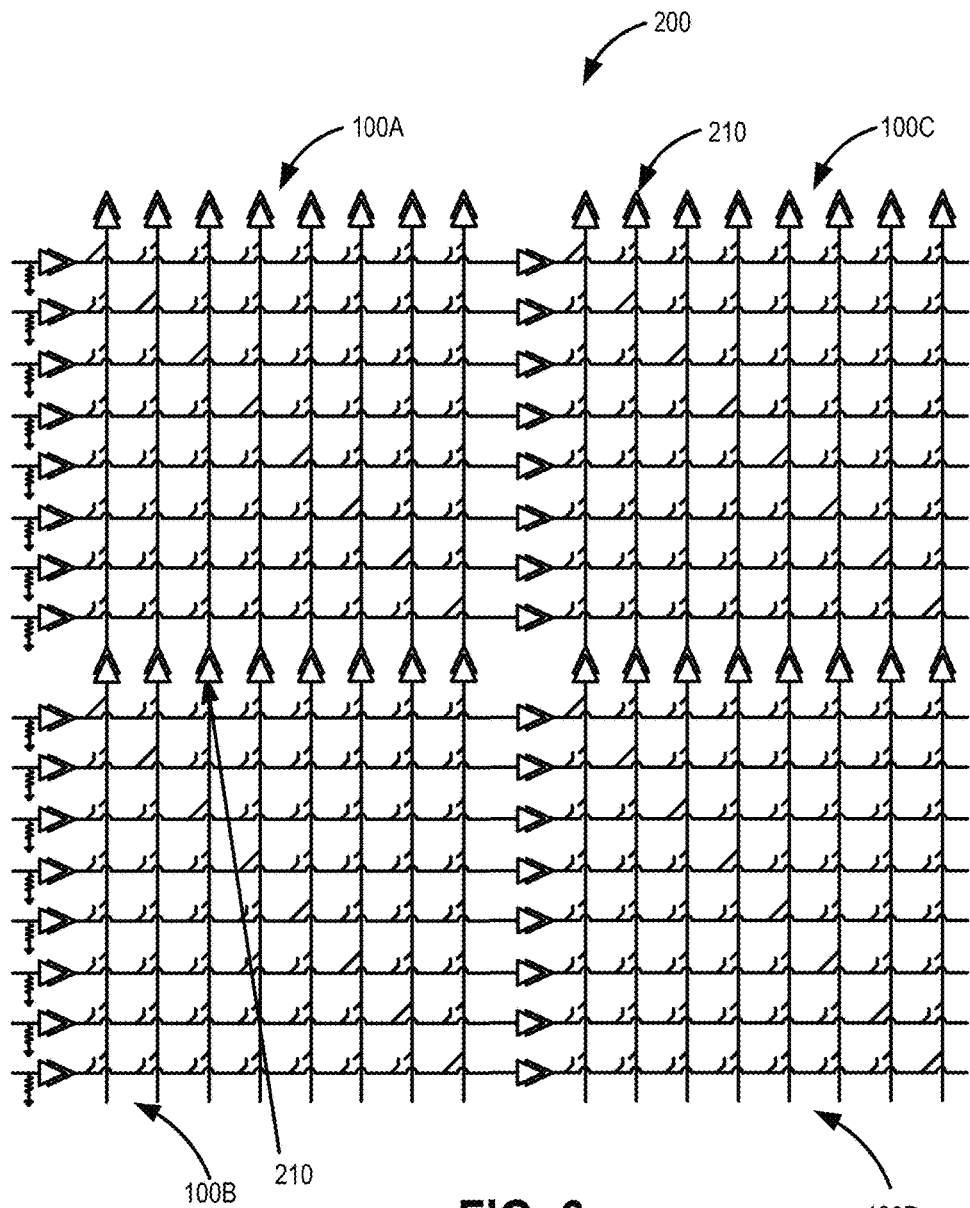
FIG. 6 is a diagram of a 16×16 cross-point switch implementation using four of the 8×8 cross-point switches.

Referring to FIG. 5, in an exemplary embodiment, graphs illustrate exemplary waveforms of a high-speed signal 120 through the 8×8 cross-point switch 100. For the simulation in FIG. 5, the high-speed signal 120 is 30 Gb/s using NRZ waveforms. FIG. 6 includes three graphs 130, 132, 134, illustrating the same high-speed signal 120 at different points in the cross-point switch 100. The graph 130 is the high-speed signal 120 is the NRZ waveform at the input to the switching matrix, i.e., an output of the input buffer 12 on the horizontal transmission line 16. The graph 132 is an input to the output buffer 14 on the top of the vertical transmission line 18, i.e., after the switch 20. Finally, the graph 134 is the regenerated output of the output buffer 14, which would serve as an output of the cross-point switch 100 or an input to a next cross-point switch 100 (in a multi-tile configuration). Only one path is shown for clarity, but all other possible switching configurations were simulated and show similar results. Note, the input buffer 12 does not need to recondition fully the high-speed signal 120, whereas the output buffer 14 is configured to provide a substantially reconditioned version of the high-speed signal 120. The total operating power consumption of the cross-point switch 100 is about 35 mW at 30 Gb/s and is fully determined by the dynamic CMOS switching power.

Referring to FIG. 6, in an exemplary embodiment, a diagram illustrates a 16×16 cross-point switch 200 implementation using four of the 8×8 cross-point switches 100A, 100B, 100C, 100D. That is, the 8×8 cross-point switch 100 is a tile, and the 16×16 cross-point switch 200 is constructed with four tiles. Other embodiments could include 8 tiles, 16 tiles, etc. The input buffers 12 to the switch 200 are on the left side and the output buffers 14 are on the top side. The switches 100A, 100B are inputs to the switch 200, providing 16 input buffers 12. The input buffers 12 on the switches 100C, 100D connect to the horizontal transmission lines 16 on the switches 100A, 100B, via tri-state buffers 210. The output buffers 14 on the switches 100B, 100D connect to the vertical transmission lines 18 on the switches 100A, 100C via the tri-state buffers. Thus, any one of the 16 input signals can be switched to any one of the 16 output signals, achieving a larger switch matrix.

The tri-state buffers 210 have three states—low, high, and disabled. The disabled stated further reduces power consumption when a particular input line is configured to switch and does not need to be connected to an adjacent switch 100B, 100C, 100D. The tri-state buffers 210 make sure unused outputs do not load subsequent lines, i.e., shutdown of unused buffers. For example, if an input to the switch 100A terminates on the switch 100A, the tri-state buffers 210 can disable the corresponding horizontal transmission line 16 input to the switch 100C and disable the corresponding vertical transmission line 18 output from the switch 100B.

It will be appreciated that some exemplary embodiments described herein may include one or more generic or specialized processors ("one or more processors") such as microprocessors; Central Processing Units (CPUs); Digital Signal Processors (DSPs): customized processors such as Network Processors (NPs) or Network Processing Units (NPUs), Graphics Processing Units (GPUs), or the like; Field Programmable Gate Arrays (FPGAs); and the like along with unique stored program instructions (including both software and firmware) for control thereof to implement, in conjunction with certain non-processor circuits, some, most, or all of the functions of the methods and/or systems described herein. Alternatively, some or all functions may be implemented by a state machine that has no stored program instructions, or in one or more Application Specific Integrated Circuits (ASICs), in which each function or some combinations of certain of the functions are implemented as custom logic or circuitry. Of course, a combination of the aforementioned approaches may be used. For some of the exemplary embodiments described herein, a corresponding device such as hardware, software, firmware, and a combination thereof can be referred to as "circuitry configured or adapted to," "logic configured or adapted to," etc. perform a set of operations, steps, methods, processes, algorithms, functions, techniques, etc. as described herein for the various exemplary embodiments.

Moreover, some exemplary embodiments may include a non-transitory computer-readable storage medium having computer readable code stored thereon for programming a computer, server, appliance, device, processor, circuit, etc. each of which may include a processor to perform functions as described and claimed herein. Examples of such computer-readable storage mediums include, but are not limited to, a hard disk, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory), Flash memory, and the like. When stored in the non-transitory computer readable medium, software can include instructions executable by a processor or device (e.g., any type of programmable circuitry or logic) that, in response to such execution, cause a processor or the device to perform a set of operations, steps, methods, processes, algorithms, functions, techniques, etc. as described herein for the various exemplary embodiments.

Although the present disclosure has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present disclosure, are contemplated thereby, and are intended to be covered by the following claims.

What is claimed is:

1. An electrical switch circuit adapted to switch digital, high-speed signals with low power, the electrical switch circuit comprising:
    a plurality of input buffers comprising a first set of digital inverters and each is coupled to an associated input transmission line of a plurality of input transmission lines;
    a plurality of output buffers comprising a second set of digital inverters and each is coupled to an associated output transmission line of a plurality of output transmission lines; and
    a plurality of switches each coupled to an associated input transmission line and an associated output transmission line and between the first set of digital inverters and the second set of digital inverters, wherein each of the input transmission line, the output transmission line, and the plurality of switches are in a single line configuration, wherein the plurality of input buffers, the plurality of output buffers, and the plurality of switches are arranged in a tile and comprise an N×N cross-point switch, wherein an M×M cross point switch, M>N, is formed by a plurality of tiles, and wherein each tile is sized smaller than a bit period length of the digital, high-speed signals.

2. The electrical switch circuit of claim 1, wherein each of the input buffers and output buffers are tri-state buffers with an enable signal.

3. The electrical switch circuit of claim 1, wherein, for the low power, each of the plurality of input transmission lines and the plurality of output transmission lines is unterminated.

4. The electrical switch circuit of claim 1, wherein, for the low power, each of the plurality of input buffers and the plurality of output buffers is unterminated.

5. The electrical switch circuit of claim 1, wherein, for the low power, each of the plurality of input buffers, the plurality of output buffers, the plurality of input transmission lines, and the plurality of output transmission lines is unterminated.

6. The electrical switch circuit of claim 1, wherein each of the plurality of switches is in a series-shunt-series configuration comprising a first series switch, a shunt switch, and a second series switch,
    wherein the first series switch and the second series switch comprise a combination of N-type metal-oxide-semiconductor (NMOS) transistors and P-type metal-oxide-semiconductor (PMOS) transistors, and
    wherein the shunt switch comprises a combination of NMOS and PMOS transistors.

7. The electrical switch circuit of claim 6, wherein the PMOS transistors are larger than the NMOS transistors.

8. The electrical switch circuit of claim 1, wherein the plurality of tiles internal to the M×M cross-point switch connect to one another via tri-state buffers which are either one of enabled for data operation or disabled.

9. An electrical switch circuit method adapted to switch digital, high-speed signals with low power, the electrical switch circuit method comprising:
    providing a plurality of input buffers comprising a first set of digital inverters and each is coupled to an associated input transmission line of a plurality of input transmission lines;
    providing a plurality of output buffers comprising a second set of digital inverters and each is coupled to an associated output transmission line of a plurality of output transmission lines; and
    providing a plurality of switches each coupled to an associated input transmission line and an associated output transmission line and between the first set of digital inverters and the second set of digital inverters, wherein each of the input transmission line, the output transmission line, and the plurality of switches are in a single line configuration, wherein the plurality of input buffers, the plurality of output buffers, and the plurality of switches are arranged in a tile and comprise an N×N cross-point switch, wherein an M×M cross point switch, M>N, is formed by a plurality of tiles, and wherein each tile is sized smaller than a bit period length of the digital, high-speed signals.

10. The electrical switch method of claim 9, wherein each of the input buffers and output buffers are tri-state buffers with an enable signal.

11. The electrical switch method of claim 9, wherein, for the low power, each of the plurality of input transmission lines and the plurality of output transmission lines is unterminated.

12. The electrical switch method of claim 9, wherein, for the low power, each of the plurality of input buffers and the plurality of output buffers is unterminated.

13. The electrical switch method of claim 9, wherein each of the plurality of switches is in a series-shunt-series configuration comprising a first series switch, a shunt switch, and a second series switch,
    wherein the first series switch and the second series switch comprise a combination of N-type metal-oxide-semiconductor (NMOS) transistors and P-type metal-oxide-semiconductor (PMOS) transistors, and
    wherein the shunt switch comprises a combination of NMOS transistors.

14. The electrical switch method of claim 9,
wherein the plurality of tiles internal to the M×M cross-point switch connect to one another via tri-state buffers which are either one of enabled for data operation and disabled.

15. An M×M cross-point switch adapted to switch digital, high-speed signals with low power, the M×M cross-point switch comprising:
one or more tiles each comprising an N×N cross-point switch, wherein each cross-point switch comprises:
a plurality of input buffers comprising a first set of digital inverters and each is coupled to an associated input transmission line of a plurality of input transmission lines;
a plurality of output buffers comprising a second set of digital inverters and each is coupled to an associated output transmission line of a plurality of output transmission lines; and
a plurality of switches each coupled to an associated input transmission line and an associated output transmission line and between the first set of digital inverters and the second set of digital inverters, and wherein each of the input transmission line, the output transmission line, and the plurality of switches are in a single line configuration, wherein the plurality of tiles internal to the M×M cross-point switch connect to one another via tri-state buffers which are either one of enabled for data operation and disabled, and wherein each tile is sized smaller than a bit period length of the digital, high-speed signals.

16. The M×M cross-point switch of claim 15, wherein, for the low power, each of the plurality of input buffers, the plurality of output buffers, the plurality of input transmission lines, and the plurality of output transmission lines is unterminated.

17. The M×M cross-point switch of claim 15, wherein switch of the plurality of switches is in a series-shunt-series configuration comprising a first series switch, a shunt switch, and a second series switch,
wherein the first series switch and the second series switch comprise a combination of N-type metal-oxide-semiconductor (NMOS) transistors and P-type metal-oxide-semiconductor (PMOS) transistors, and
wherein the shunt switch comprises a combination of NMOS and PMOS transistors.

18. The M×M cross-point switch of claim 15, wherein the plurality of input buffers comprise a first two-stage buffer of two digital inverters and the plurality of output buffers comprise a second two-stage buffer of two digital inverters,
wherein the first two-stage buffer comprises a combination of N-type metal-oxide-semiconductor (NMOS) transistors and P-type metal-oxide-semiconductor (PMOS) transistors, and
wherein the second two-stage buffer comprises a combination of N-type metal-oxide-semiconductor (NMOS) transistors and P-type metal-oxide-semiconductor (PMOS) transistors.

* * * * *